United States Patent [19]
Ohtani et al.

[11] Patent Number: 5,612,250
[45] Date of Patent: Mar. 18, 1997

[54] METHOD FOR MANUFACTURING A SEMICONDUCTOR DEVICE USING A CATALYST

[75] Inventors: Hisashi Ohtani; Akiharu Miyanaga; Hongyong Zhang; Naoaki Yamaguchi; Atsunori Suzuki, all of Kanagawa, Japan

[73] Assignee: Semiconductor Energy Laboratory Co., Ltd., Kanagawa, Japan

[21] Appl. No.: 481,061

[22] Filed: Jun. 7, 1995

Related U.S. Application Data

[63] Continuation-in-part of Ser. No. 341,935, Nov. 16, 1994, Pat. No. 5,543,352.

[30] Foreign Application Priority Data

Dec. 1, 1993 [JP] Japan .................................. 5-329761

[51] Int. Cl.$^6$ .................................................. H01L 21/20
[52] U.S. Cl. ......................... 437/101; 437/173; 437/174; 437/245; 437/230; 437/233; 437/238
[58] Field of Search .................................. 437/101, 233, 437/173, 174, 230, 238, 245

[56] References Cited

U.S. PATENT DOCUMENTS 5,147,826  9/1992  Liu et al. .
5,275,851  1/1994  Fonash et al. .

OTHER PUBLICATIONS

C. Hayzelden et al., "In Situ Transmission Electron Microscopy Studies of Silicide–Mediated Crystallization of Amorphous Silicon" (3 pages).
A. V. Dvurechenskii et al., "Transport Phenomena in Amorphous Silicon Doped by Ion Implantation of 3d Metals", Akademikian Lavrentev Prospekt 13, 630090 Novosibirsk 90, USSR, pp. 635–640.
T. Hempel et al., "Needle–Like Crystallization of Ni Doped Amorphous Silicon Thin Films", *Solid State Communications*, vol. 85, No. 11, pp. 921–924, 1993.
"Crystallized Si Films By Low–Temperature Rapid Thermal Annealing Of Amorphous Silicon", R. Kakkad, J. Smith, W. S. Lau, S. J. Fonash, J. Appl. Phys. 65 (5), Mar. 1, 1989, 1989 American Institute of Physics, pp. 2069–2072.
"Polycrystalline Silicon Thin Film Transistors on Corning 7059 Glass Substrates Using Short Time, Low Temperature Processing", G. Liu, S. J. Fonash, Appl. Phys. Lett. 62 (20), May 17, 1993, 1993 American Institute of Physics, pp. 2554–2556.
"Selective Area Crystallization of Amorphous Silicon Films by Low–Temperature Rapid Thermal Annealing", Gang Liu and S. J. Fonash, Appl. Phys. Lett. 55 (7), Aug. 14, 1989, 1989 American Institute of Physics, pp. 660–662.
"Low Temperature Selective Crystallization of Amorphous Silicon", R. Kakkad, G. Liu, S. J. Fonash, Journal of Non–Crystalline Solids, vol. 115, (1989), pp. 66–68.

*Primary Examiner*—R. Bruce Breneman
*Assistant Examiner*—Ramamohan Rao Paladugu
*Attorney, Agent, or Firm*—Sixbey, Friedman, Leedom & Ferguson, P.C.; Gerald J. Ferguson, Jr.

[57]  ABSTRACT

A method for manufacturing a thin film transistor having a crystalline silicon layer as an active layer comprises the steps of disposing a solution containing a catalyst for promoting a crystallization of silicon in contact with an amorphous silicon film, crystallizing the amorphous silicon at a relatively low temperature and then improving the crystallinity by irradiating the film with a laser light. The concentration of the catalyst in the crystallized silicon film can be controlled by controlling the concentration of the catalyst in the solution.

1 Claim, 7 Drawing Sheets

METHOD FOR MANUFACTURING A SEMICONDUCTOR DEVICE USING A CATALYST

This is a continuation in part application of Ser. No. 08/341,935 filed on Nov. 16, 1994 now U.S. Pat. No. 5,543,352.

BACKGROUND OF THE INVENTION

1. Field of the Invention

The present invention relates to a process for manufacturing a semiconductor device having a crystalline semiconductor.

2. Prior Art

Thin film transistors (referred to hereinafter as "TFTs") are well known and are widely used in various types of integrated circuits or an electro-optical device, and particularly used for switching elements provided to each of pixels of an active matrix liquid crystal display device as well as in driver elements of the peripheral circuits thereof.

An amorphous silicon film can be readily utilized as a thin film semiconductor of a TFT. However, electric characteristics of the amorphous silicon film are poor. A silicon film having a crystallinity may be used for solving this problem. The silicon film having a crystallinity is, for example, polycrystalline silicon, polysilicon, and microcrystalline silicon. The crystalline silicon film can be prepared by first forming an amorphous silicon film, and then heat treating the resulting film for crystallization.

The heat treatment for the crystallization of the amorphous silicon film requires heating the film at a temperature of 600° C. or higher for a duration of 10 hours or longer. Such a heat treatment is detrimental for a glass substrate. For instance, a Corning 7059 glass commonly used for the substrate of active matrix liquid crystal display devices has a glass distortion point of 593° C., and is therefore not suitable for large area substrates that are subjected to heating at a temperature of 600° C. or higher.

According to the study of the present inventors, it was found that the crystallization of an amorphous silicon film can be effected by heating the film at 550° C. for a duration of about 4 hours. This can be accomplished by disposing a trace amount of nickel or palladium, or other elements such as lead, onto the surface of the amorphous silicon film.

The foregoing elements which promote crystallization can be introduced into the surface of the amorphous silicon film by depositing the elements by plasma treatment or vapor deposition, or by incorporating the elements by ion implantation. The plasma treatment more specifically comprises adding the catalyst elements into the amorphous silicon film by generating a plasma in an atmosphere such as gaseous hydrogen or nitrogen using an electrode containing catalyst elements therein in a plasma CVD apparatus of a parallel plate type or positive columnar type.

However, the presence of the foregoing elements in a large quantity in the semiconductor is not preferred, because the use of such semiconductors greatly impairs the reliability and the electric stability of the device in which the semiconductor is used.

That is, the foregoing elements such as nickel which promotes a crystallization (in this invention, these elements will be called as catalyst elements hereinbelow) are necessary in the crystallization of the amorphous silicon film, but are preferably not incorporated in the crystallized silicon. These conflicting requirements can be accomplished by selecting an element which is more inactive in crystalline silicon as the catalyst element, and by incorporating the catalyst element at a minimum amount possible for the crystallization of the film. Accordingly, the quantity of the catalyst element to be incorporated in the film must be controlled with high precision.

The crystallization process using nickel or the like was studied in detail. The following findings were obtained as a result:

(1) In case of incorporating nickel by a plasma treatment into an amorphous silicon film, nickel is found to penetrate into the film to a considerable depth of the amorphous silicon film before subjecting the film to a heat treatment;

(2) The initial nucleation occurs from the surface from which nickel is incorporated: and (3) When a nickel layer is deposited on the amorphous silicon film by evaporation, the crystallization of an amorphous silicon film occurs in the same manner as in the case of effecting plasma treatment.

In view of the foregoing, it is assumed that not all of the nickel introduced by the plasma treatment functions to promote the crystallization of silicon. That is, if a large amount of nickel is introduced, there exists an excess amount of the nickel which does not function effectively. For this reason, the inventors consider that it is a point or face at which the nickel contacts the silicon that functions to promote the crystallization of the silicon at lower temperatures. Further, it is assumed that the nickel has to be dispersed in the silicon in the form of atoms. Namely, it is assumed that nickel needs to be dispersed in the vicinity of a surface of an amorphous silicon film in the form of atoms, and the concentration of the nickel should be as small as possible but within a range which is sufficiently high to promote the low temperature crystallization.

A trace amount of nickel i.e., a catalyst element capable of promoting the crystallization of the amorphous silicon, can be incorporated in the vicinity of the surface of the amorphous silicon film by, for example, vapor deposition. However, vapor deposition is disadvantageous concerning the controllability, and is therefore not suitable for precisely controlling the amount of the catalyst element to be incorporated in the amorphous silicon film.

Also, it is required to minimize the amount of the catalyst element but there occurs a problem that a crystallization does not occur sufficiently.

SUMMARY OF THE INVENTION

It is an object of the present invention to manufacture a crystalline thin film silicon semiconductor device through a heat process at less than 600° C. using a catalyst element, wherein (1) the amount of the catalyst element to be introduced is controlled and minimized, (2) the productivity is increased, and (3) the crystallinity is improved as compared with the case in which a heat treatment is applied.

In order to achieve the foregoing objects, the method of the present invention comprises the steps of disposing a catalyst element for promoting a crystallization or a compound containing the catalyst element in contact with an amorphous silicon film, heat treating the amorphous silicon film with the catalyst element or the compound kept in contact with the silicon film in order to crystallize a part or a whole of the film, and further improving or enlarging the crystallinity by irradiating the film with a laser light or a light having an equivalent strength thereto. Thus, a silicon film having an excellent crystallinity is formed.

As a method for introducing the catalyst element, it is advantageous to coat an amorphous silicon film with a solution containing the catalyst element. In particular, in accordance with the present invention, the solution should contact the surface of the silicon film in order that the amount of the catalyst element to be introduced should be accurately controlled.

The catalyst may be introduced from either upper or lower surface of the amorphous silicon film. Namely, in the former case, a catalyst containing solution may be applied onto the amorphous silicon film after the formation thereof. Also, in the latter case, the solution may be applied first onto a base surface and then the amorphous silicon film is formed thereon.

By utilizing the silicon film having a crystallinity thus formed, it is possible to form an active region including therein at least one electric junction such as PN, PI or NI junction. Examples of semiconductor devices are thin film transistors (TFT), diodes, photo sensor, etc.

The foregoing construction of the present invention has the following basic advantages:

(a) The concentration of the catalyst element in the solution can be accurately controlled in advance, and it is possible to improve the crystallinity while the amount of the catalyst element can be minimized;

(b) The amount of the catalyst element incorporated into the amorphous silicon film can be determined by the concentration of the catalyst element in the solution so long as the surface of the amorphous silicon film is in contact with the solution;

(c) The catalyst element can be incorporated at a minimum concentration necessary for the crystallization into the amorphous silicon film, because the catalyst element adsorbed by the surface of the amorphous silicon film principally contributes to the crystallization of the film; and (d) A crystalline silicon having an excellent crystallinity can be obtained without a high temperature process.

As a solution, various aqueous solutions and organic solvent solutions can be used in the present invention. The word "including" or "containing" mentioned in the present specification may be understood as either (a) that the catalytic element is simply dispersed in a solution or (b) that the catalytic element is contained in a solution in a form of a compound.

As a solvent, it is possible to use water, alcohol, acid, or ammonium which are polar solvent.

Examples of nickel compounds which are suitable for the polar solvent are nickel bromide, nickel acetate, nickel oxalate, nickel carbonate, nickel chloride, nickel iodide, nickel nitrate, nickel sulfate, nickel formate, nickel acetyl acetonate, 4-cyclohexyl butyric acid, nickel oxide and nickel hydroxide.

Also, benzene, toluene, xylene, carbon tetrachloride, chloroform or ether can be used as a non-polar solvent. Examples of nickel compounds suitable for a non-polar solvent are nickel acetyl acetonate and 2-ethyl hexanoic acid nickel.

Further, it is possible to add an interfacial active agent to a solution containing a catalytic element. By doing so, the solution can be adhered to and adsorbed by a surface at a higher efficiency. The interfacial active agent may be coated on the surface in advance of coating the solution.

Also, when using an elemental nickel (metal), it is necessary to use an acid to dissolve it.

While nickel is completely dissolved in the above listed solutions, it is possible to use a material such as an emulsion in which elemental nickel or nickel compound is dispersed uniformly in a dispersion medium. Furthermore, it is possible to use a solution which is used for forming an oxide film. An example of such a solution is OCD (Ohka Diffusion Source) manufactured by Tokyo Ohka Co. Ltd. In this case, after forming the OCD on a surface, a silicon oxide film can be easily formed simply by baking at about 200° C. Also, an impurity can be added arbitrarily.

The foregoing explanations apply to the case of using a material other than nickel as the catalyst element.

When using a polar solvent such as water for dissolving nickel, it is likely that an amorphous silicon film repels such a solution. In such a case, a thin oxide film is preferably formed on the amorphous silicon film so that the solution can be provided thereon uniformly. The thickness of the oxide film is preferably 100 Å or less. Also, it is possible to add an interfacial active agent to the solution in order to increase a wetting property.

Also, when using a non-polar solvent such as toluene for obtaining a solution of 2-ethyl hexanoic acid nickel, the solution can be directly formed on the surface of an amorphous silicon film. However, it is possible to interpose between the amorphous silicon film and the solution a material for increasing the adhesivity therebetween which is used to increase adhesivity of a resist. However, if the amount of the coating of this material is too much, it would prevent the catalyst element from being introduced into the amorphous silicon film.

The concentration of the catalyst element in the solution depends on the kind of the solution, however, roughly speaking, the concentration of the catalyst element such as nickel by weight in the solution is 1 ppm to 200 ppm, and preferably, 1 ppm to 50 ppm. The concentration is determined based on the nickel concentration in the silicon film or the resistance against hydrofluoric acid of the film after the completion of the crystallization.

It is possible to further improve the crystallinity of the silicon film by irradiating the silicon film with a laser light after the heat crystallization thereof. Also, if the crystallization is caused to a portion of the silicon film by the heat treatment, it is possible to expand the crystallization therefrom by means of a laser light, resulting in achieving a higher crystallinity.

For example, when the amount of the catalyst element is small, the crystallization locally occurs at small spot regions of the silicon film. This condition can be regarded as a mixture of a crystalline component and an amorphous component. By using the laser light in this condition, crystal growths occur from the crystal nuclei which exist in the crystalline component and thus it is possible to obtain a higher crystallinity. In other words, small crystal grains are grown into larger crystal grains. The effect of the use of the laser irradiation is more apparent with respect to a silicon film of which crystallinity is incomplete.

Also, in place of laser light, it is possible to use other intense lights such as an infrared ray. The IR ray is difficult to be absorbed by glass while it is easy to be absorbed by a silicon thin film. Therefore, the use of IR light is advantageous for selectively heating a silicon film formed on a glass substrate. The method in which this IR ray is used is called rapid thermal annealing (RTA) or rapid thermal process (RTP).

The crystal growth can be controlled by applying the solution containing the catalyst element to a selected portion of the amorphous silicon film. In particular, the crystals grow within the silicon film by heating, the silicon film in a direction approximately parallel with the plane of the silicon film from the region onto which the solution is directly applied toward the region onto which the solution is not applied. The region in which the crystals grow in this manner will be referred to in the present invention as a lateral crystal growth region or simply as a lateral growth region.

It is also confirmed that this lateral growth region contains the catalyst element at a lower concentration. While it is useful to utilize a crystalline silicon film as an active layer region of a semiconductor device, in general, the concentration of the impurity in the active region should be reduced as much as possible. Accordingly, the use of the lateral growth region for the active layer region is useful in a device fabrication.

The use of nickel as the catalyst element is found most effective in the process according to the present invention. However, other catalyst elements may be used in place of nickel, for example, palladium (Pd), platinum (Pt), copper (Cu), silver (Ag), gold (Au), indium (In), tin (Sn), phosphorus (P), arsenic (As), and antimony (Sb). Otherwise, the catalyst element may be at least one selected from the elements belonging to the Group VIII, IIIb, IVb, and Vb of the periodic table.

Also, the solution for introducing the catalyst element should not be limited to water solution or alcohol solution. Various materials may be used which contains the catalyst element. For example, a metal compound or an acid which contains a catalyst element may be used.

BRIEF DESCRIPTION OF THE DRAWINGS

The foregoing and other features of the present invention will b e described in further detail in the preferred embodiments of the present invention with reference to the attached drawings in which.

DESCRIPTION OF THE PREFERRED EMBODIMENTS OF THE INVENTION

EXAMPLE 1

In this example, a catalyst element contained in a water solution is applied onto an amorphous silicon, following which it is crystallized by heating and further by laser irradiation.

Figure 1A:
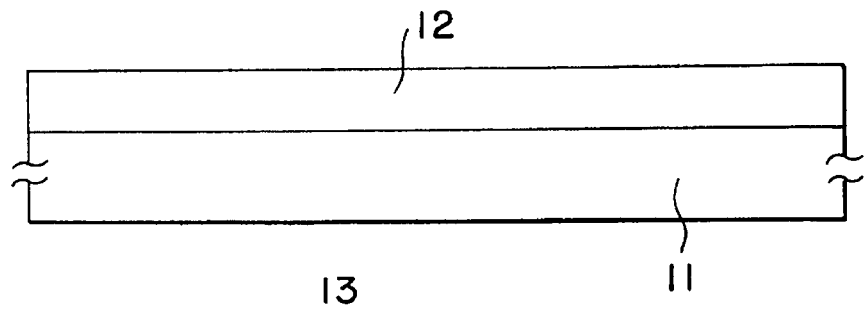
FIGS. 1A–1D show a method for forming a crystalline silicon film in accordance with EXAMPLE 1 of the invention.
Figure 1B:
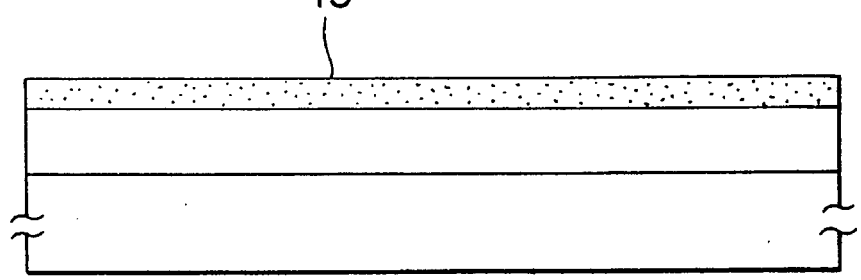

Referring to FIGS. 1A–1D, the process for incorporating a catalyst element (nickel In this case) into the amorphous silicon film is described below. A Corning, 7059 glass substrate of 100 mm×100 mm in size is used Initially, an amorphous silicon film of 100 to 1,500 Å in thickness is deposited by plasma CVD or LPCVD. More specifically in this case, an amorphous silicon film 12 is deposited at a thickness of 1,000 Å by plasma CVD (FIG. 1A).

Then, the amorphous silicon film is subjected to hydrofluoric acid treatment to remove contaminants and a natural oxide formed thereon. This treatment is followed by the deposition of an oxide film 13 on the amorphous silicon film to a thickness of 10 to 50 Å. A natural oxide film may be utilized as the oxide film instead of the oxide film 13 if the contaminants can be disregarded.

The precise thickness of the oxide film 13 is not available because the film is extremely thin. However, it is presumed to be about 20 Å in thickness. The oxide film 13 is formed by irradiating an ultraviolet (UV) radiation in an oxygen atmosphere for a duration of 5 minutes. The oxide film 13 can be formed otherwise by thermal oxidation. Furthermore, the oxide film can be formed by a treatment using aqueous hydrogen peroxide.

The oxide film 13 is provided with an aim to fully spread the acetate solution containing nickel, which is to be applied in the later step, on the entire surface of the amorphous silicon film. More briefly, the oxide film 13 is provided for improving the wettability of the amorphous silicon film. If the aqueous acetate solution were to be applied directly, for instance, the amorphous silicon film would repel the aqueous acetate solution and prevent nickel from being incorporated uniformly into the surface of the amorphous silicon film. This means that a uniform crystallization can not be done.

Figure 1C:
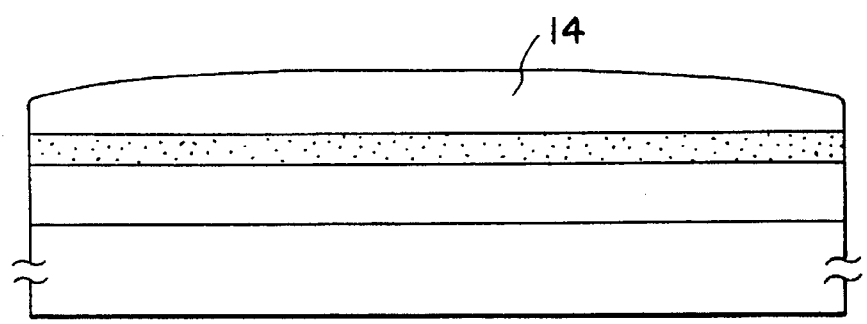
Figure 1D:
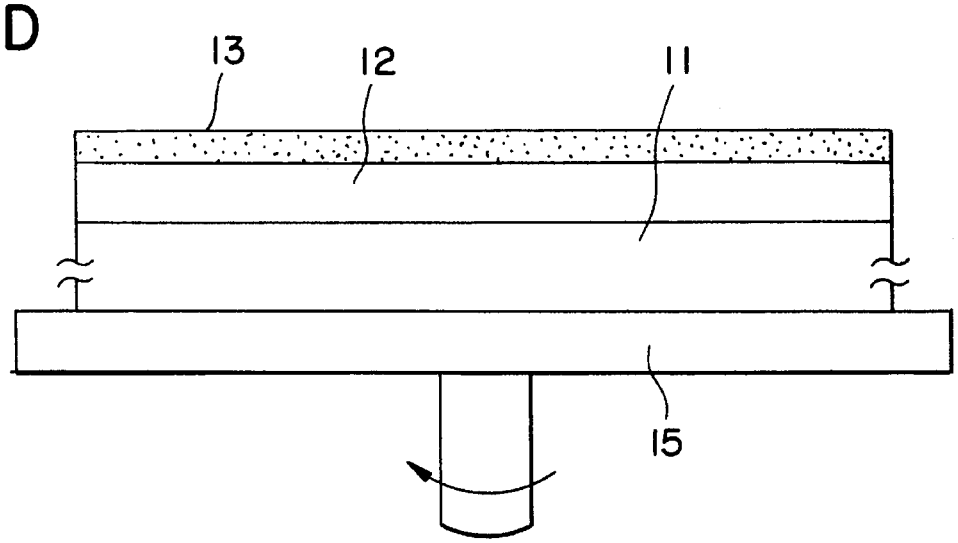

An acetate solution containing, nickel added therein is prepared thereafter. More specifically, an acetate solution containing nickel at a concentration of 25 ppm, is prepared. Two milliliters of the acetate solution is dropped to the surface of the oxide film 13 on the amorphous silicon film 12, and is maintained as it is for a duration of 5 minutes. Then, spin drying at 2,000 rpm using a spinner is effected for 60 seconds. (FIGS. 1C and 1D).

The concentration of nickel in the acetate solution is practically 1 ppm or more, preferably, 10 ppm or higher. In case of using a nonpolar solvent such as toluene for obtaining a solution of 2-ethyl hexanoic acid nickel, the oxide 13 is unnecessary and the solution can be directly formed on the amorphous silicon Film.

The coating of the solution is carried out at one time or may be repeated, thereby, it is possible to form a film containing nickel on the surface of the amorphous silicon film 12 uniformly to a thickness of several angstroms to several hundreds angstroms after the spin dry. The nickel contained in this film will diffuse into the amorphous silicon film during a heating process carried out later and will function to promote the crystallization of the amorphous silicon film. By the way, it is the inventors, intention that the film containing nickel or other catalyst elements do not necessarily have to be in the form of a completely continuous film.

The amorphous silicon film coated with the above solution is kept as it is thereafter for a duration of 1 minute. The concentration of nickel catalyst element in the crystallized silicon film 12 can be controlled by changing this retention time, however, the most influencing factor in controlling the concentration is the concentration of the nickel catalyst element in the solution.

The silicon film coated with a nickel-containing solution thus obtained is subjected to a heat treatment at a temperature of 550° C. for a duration of 4 hours in a nitrogen atmosphere in a heating furnace. Thus, a thin film of crystalline silicon 12 is formed on the substrate 11.

The heat treatment can be effected at a temperature of 450° C. or higher. If a low temperature is selected, however, the heat treatment would consume much time and result in a poor production efficiency. If a heat treatment temperature of 550° C. or higher were to be selected, on the other hand, the problem of heat resistance of the glass substrate must be considered.

Also, it is possible to form the solution containing the catalyst element on a substrate surface prior to the formation of the amorphous silicon film as said before.

After the crystallization by heating, the crystallinity of the silicon film 12 is further improved by irradiating the film with several shots of a KrF excimer laser (wavelength: 248 nm, pulse width: 30 nsec) in a nitrogen atmosphere with a power density of 200–350 mJ/cm². An IR ray may be used instead of the laser as said before.

EXAMPLE 2

The present example relates to a process similar to that described in Example 1, except that a silicon oxide film 1,200 Å in thickness is provided selectively as a mask to incorporate nickel into selected regions of the amorphous silicon film.

Figure 2A:
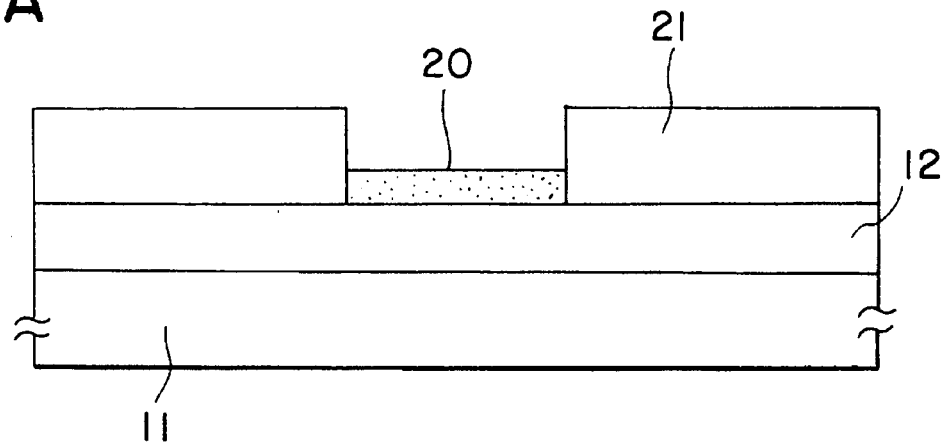
FIGS. 2A–2C show a method for forming a crystalline silicon film in accordance with EXAMPLE 2 of the invention.

Referring to FIG. 2A, a silicon oxide film 21 to be used as a mask is formed on a glass substrate (Corning 7059, 10 centimeters square) is formed to a thickness of 1000 Å ore more, for example, 1200 Å. It may be thinner than this, for example, 500 Å as long as the film is sufficiently dense as a mask.

The silicon oxide film 21 is patterned into a predetermined pattern thereafter by means of a conventional photolithography technique. Thereafter, a thin silicon oxide film 20 is formed by irradiating, a UV radiation in oxygen atmosphere for 5 minutes. The thickness of the silicon oxide film 20 is presumably from 20 to 50 Å. The function of the silicon oxide film 20 thus formed for improving the wettability of the amorphous silicon film may be provided by the hydrophilic nature of the silicon oxide film formed as the mask if the solution is matched with the size of the mask pattern. However, this is a special case, and, in general, a silicon oxide film 20 is safely used.

Figure 2B:
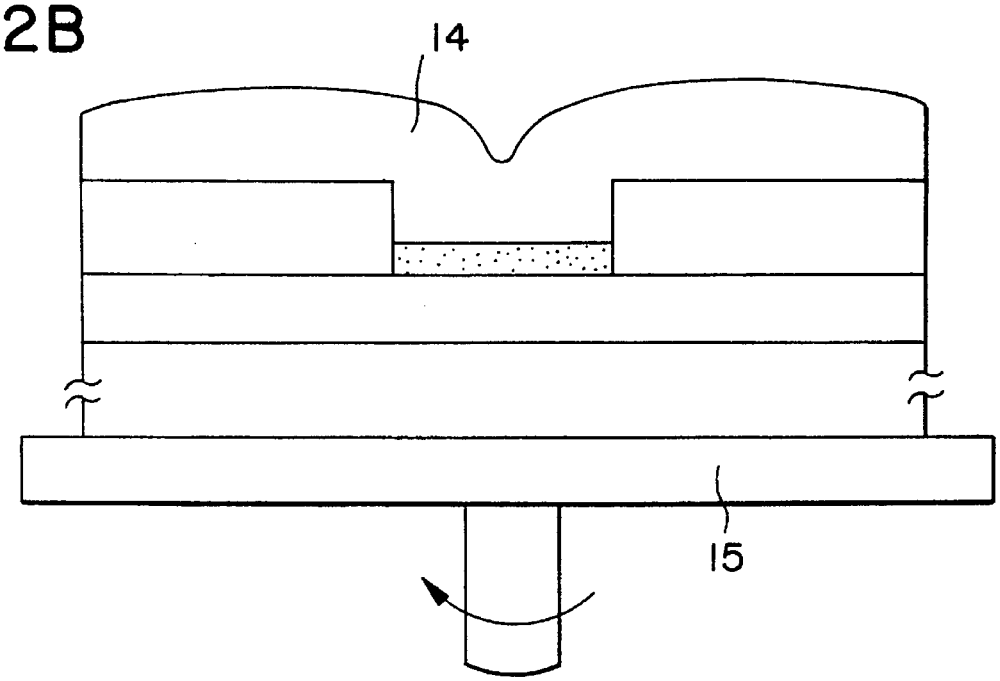

Then, similar to the process described in Example 1,5 milliliters (with respect to a substrate 10 cm×10 cm in size) of an acetate solution containing 100 ppm of nickel is dropped to the surface of the resulting structure. A uniform aqueous film is formed on the entire surface of the substrate by effecting spin coating using a spinner at 50 rpm for a duration of 10 seconds. Then, after maintaining the solution for a duration of 5 minutes on the surface, it is subjected to spin drying using a spinner at a rate of 2,000 rpm for a duration of 60 seconds. During the retention time, the substrate may be rotated on the spinner at a rate of 150 rpm or lower (FIG. 2B).

Figure 2C:
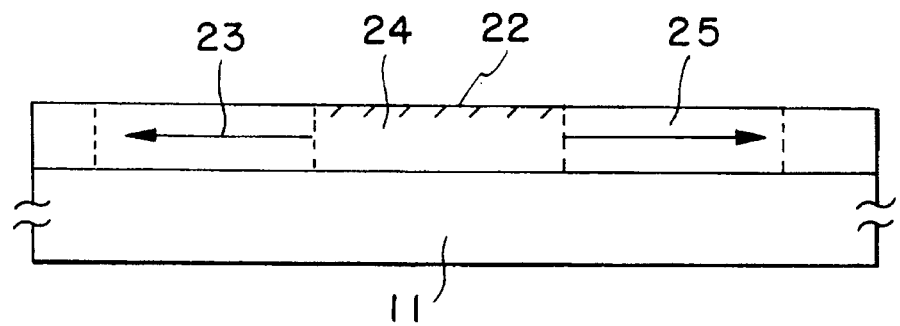

The amorphous silicon film 12 is crystallized thereafter by applying heat treatment at 550° C. for a duration of 4 hours in gaseous nitrogen. It can be seen that the crystal growth proceeds along a lateral direction from the region 22 into which nickel is introduced toward the region 25 into which nickel is not directly introduced as shown by arrow 23. In FIG. 2C, the reference numeral 24 shows a region in which the nickel is directly introduced to cause the crystallization and the reference numeral 25 shows a region in which the crystallization proceeds laterally from the region 24. It has been confirmed by the inventors that the crystal growth is along the axis of [111].

After the crystallization by the above heat treatment, the crystallinity of the silicon film is further improved by means of a XeCl excimer laser (wavelength: 308 nm). In particular, the crystallinity in the region 25 in which the lateral growth occurs can be remarkably improved.

Also, it is advantageous to heat the substrate or the surface to be irradiated during the laser irradiation at a temperature of 200° C. to 450° C.

By controlling the concentration of the solution or the retention time, it is possible to control the concentration of nickel in the region 24 of the silicon film where the nickel is directly added within a range of $1\times10^{16}$ atoms/cm³ to $1\times10^{19}$ atoms/cm³. At the same time, the concentration of the nickel in the lateral growth direction can be controlled to be lower than that.

The crystalline silicon film thus fabricated by the process according to the present invention is characterized in that it exhibits an excellent resistance against hydrofluoric acid. To the present inventors' knowledge, if the nickel is introduced by a plasma treatment, the resistivity of the crystallized silicon against a hydrofluoric acid is poor.

When a silicon oxide film is formed on a crystalline silicon film as a gate insulator or an interlayer insulator, there is a case where the silicon oxide film is provided with a contact hole through which an electrode is to be formed. In such a case, a buffered hydrofluoric acid is usually used to etch the silicon oxide. However, when the crystalline silicon film does not have a sufficient resistance against the hydrofluoric acid, it is difficult to selectively remove the silicon oxide without etching the crystalline silicon.

However, in the present invention, the difference in an etching rate (selection ratio) between the silicon oxide film and the crystalline silicon film is large enough to remove only the silicon oxide film since the crystalline silicon film of the present invention has a sufficient resistance against the hydrofluoric acid.

As said before, the concentration of the catalyst element in the lateral growth area can be made small and has an excellent crystallinity. For this reason, the lateral growth region is suitable for an active region of a semiconductor device, for example, a channel region of a thin film transistor.

EXAMPLE 3

The present example is directed to a manufacturing of a TFT using a crystalline silicon film in accordance with the present invention. The TFT of this example is suitable for a driver circuit or pixels in an active matrix type liquid crystal display device. The TFT of the present invention is also suitable in other types of thin film integrated circuits.

Referring to FIGS. 3A to 3E, the process for fabricating a TFT according to the present example will be described. A silicon oxide film (not shown in the figure) is deposited to a thickness of 2,000 Å as a base film on a glass substrate. This silicon oxide film is provided to prevent the diffusion of impurities from the glass substrate.

An amorphous silicon film is then deposited to a thickness of 1,000 Å in a manner similar to that used in Example 1. After removing the natural oxide film by a treatment using hydrofluoric acid, a thin film of an oxide film is formed to a thickness of about 20 Å by means of UV irradiation under a gaseous oxygen atmosphere. The formation of this oxide film may be carried out by a hydrolysis treatment or thermal oxidation.

Then, the amorphous silicon film having the oxide film thereon is coated with an aqueous acetate solution containing nickel at a concentration of 10 ppm. The substrate is maintained for 5 minutes after the coating and thereafter, the solution is dried by dry spinning. The silicon oxide films 20 and 21 is removed thereafter using a buffered hydrofluoric acid. Then, the silicon film is crystallized by heating at 550° C. for a duration of 4 hours. The process up to this step is the same as that described in Example 1.

After the foregoing steps, a silicon film in which an amorphous component and a crystalline component is mixed is obtained. Crystal nuclei exists within the crystalline component. This structure is then irradiated with a KrF excimer laser at a power density of 200–300 mJ in order to improve the crystallinity. At this time, the substrate is maintained at 400° C. In this way, crystal growth based on the crystal nuclei existing in the crystalline component occurs.

Figure 3A:
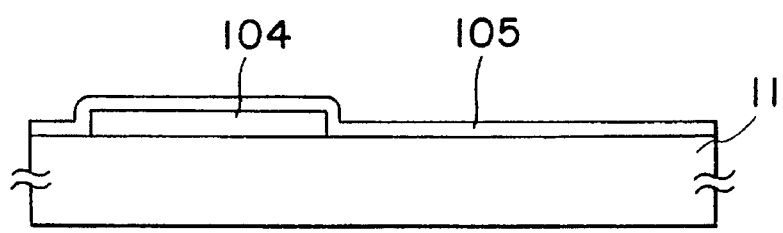
FIGS. 3A–3E show a method for manufacturing a TFT in accordance with EXAMPLE 3 of the invention.

Then, the crystalline silicon film is patterned into an island form 104 as shown in FIG. 3A. The island form silicon functions as a channel region of a TFT. Then, a silicon oxide film 105 is formed to a thickness of 200–1500 Å, for example, 1000 Å. This oxide film functions as a gate insulating layer.

The silicon oxide film 105 is deposited by means of RF plasma CVD process using TEOS (tetraethoxysilane). That is, TEOS is decomposed and then deposited together with oxygen at a substrate temperature of 150° to 600° C., preferably in the range of 300° to 450° C. TEOS and oxygen are introduced at a pressure ratio of 1:1 to 1:3 under a total pressure of 0.05 to 0.5 Torr, while applying an RF power of 100 to 250 W. Otherwise, the silicon oxide film can be fabricated by reduced pressure CVD or normal pressure CVD using TEOS as the starting gas together with gaseous ozone, while maintaining the substrate temperature in the range of from 350° to 600° C., preferably, in the range of from 400° to 550° C. The film thus deposited is annealed in oxygen or ozone in the temperature range from 400° to 600° C. for a duration of 30 to 60 minutes.

The crystallization of the silicon region 104 can be further improved b y irradiating a laser beam using a KrF excimer laser (operating at a wavelength of 248 nm at a pulse width of 20 nsec) or an intense light equivalent thereto. The application of RTA (rapid thermal annealing) using infrared ray is particularly effective because the silicon film can be heated selectively without heating the glass substrate. Moreover, RTA is especially useful in the fabrication of insulated gate field effect semiconductor devices because it decreases the interface level between the silicon layer and the silicon oxide film.

Figure 3B:
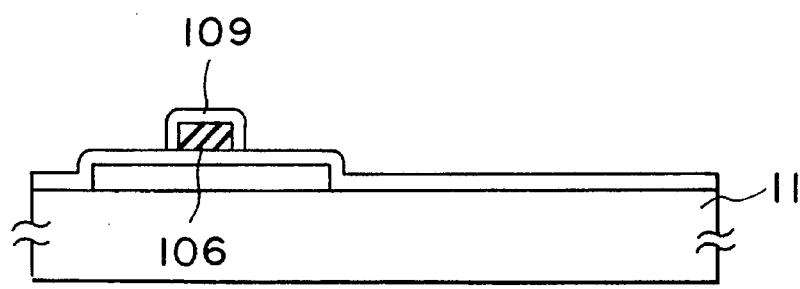
Figure 3C:
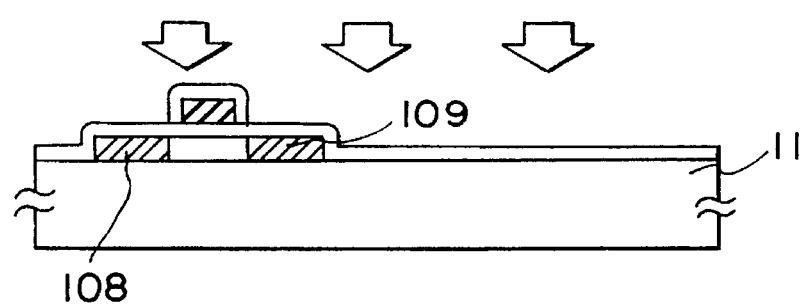

Subsequently, an aluminum film is deposited to a thickness of from 2,000 Å to 1 µm by electron beam evaporation, and is patterned into a gate electrode 106. The aluminum film may contain from 0.15 to 0.2% by weight of scandium as a dopant. The substrate is then immersed into an ethylene glycol solution controlled to a pH of about 7 and containing 1 to 3% tartaric acid to effect anodic oxidation using platinum as the cathode and the aluminum gate electrode as the anode. The anodic oxidation is effected by first increasing the voltage to 220 V at a constant rate, and then holding the voltage at 220 V for 1 hour to complete the oxidation. In case a constant current is applied as in the present case, the voltage is preferably increased at a rate of from 2 to 5 V/minute. An anodic oxide 109 is formed at a thickness of from 1,500 to 3,500 Å, more specifically, at a thickness of, for example, 2,000 Å in this manner (FIG. 3B).

Impurities (specifically in this case, phosphorus) are introduced into the island-form silicon film of the TFT in a self-aligning manner by ion doping (plasma doping) using the gate electrode portion as a mask. Phosphine ($PH_3$) is used as a doping gas to implant phosphorus at a dose of from $1 \times 10^{15}$ to $4 \times 10^{15}$ atoms/cm$^2$.

The crystallinity of the portion whose crystallinity is impaired by the introduction of the impurity is cured by irradiating a laser beam using a KrF excimer laser operating at a wavelength of 248 nm and a pulse width of 20 nsec. The laser is operated at an energy density of from 150 to 400 mJ/cm$^2$, preferably, in a range from 200 to 250 mJ/cm$^2$. Thus are formed N-type impurity regions doped with phosphorus) 108 and 109. The sheet resistance of the regions is found to be in the range of 200 to 800 Ω/square.

This step of laser annealing can be replaced by an RTA process, i.e., a rapid thermal annealing process using a flash lamp where the temperature of the sample is rapidly increased to 1000°–1200° C. (in terms of a silicon monitor).

Figure 3D:
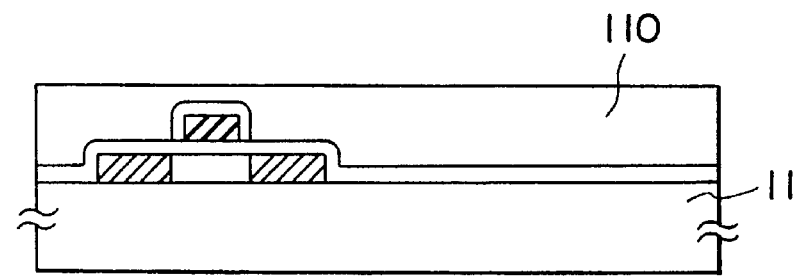

A silicon oxide film is deposited thereafter to a thickness of 3,000 Å as an interlayer insulator 110 by means of plasma CVD using TEOS together with oxygen, or by means of reduced pressure CVD or normal pressure CVD using TEOS together with ozone. The substrate temperature is maintained in the range of 250° to 450° C., for instance, at 350° C. A smooth surface is obtained thereafter by mechanically polishing the resulting silicon oxide film. (FIG. 3D).

Figure 3E:
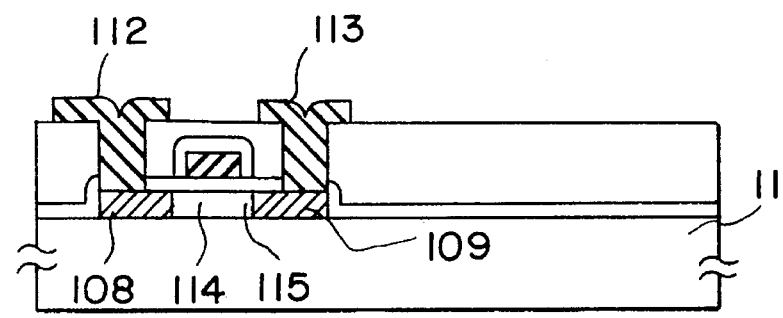

The interlayer insulator 110 is etched to form contact holes at the source/drain as shown in FIG. 3E, and interconnections 112 and 113 are formed using chromium or titanium nitride.

While it was difficult to form the contact holes by etching without etching the silicon film in the case of introducing the nickel by a plasma treatment of a conventional method, the use of the low concentration solution of 10 ppm for introducing the nickel is particularly advantageous for obtaining the contact holes.

A complete TFT can be formed by finally annealing the silicon film in hydrogen in a temperature range of 300° to 400° C. for a duration of from 0.1 to 2 hours to accomplish the hydrogenation of the silicon film. A plurality of TFTs similar to the one described hereinbefore are fabricated simultaneously, and are arranged in a matrix to form an active matrix liquid crystal display device. The TFT includes source and drain regions 108 and 109 and a channel region 114. Also, the reference numeral 115 shows an electrical junction of NI.

In accordance with the present example, the concentration of the nickel contained in the active layer can be kept lower than $3 \times 10^{18}$ atoms/cm$^3$, more specifically, in the range of $5 \times 10^{16}$ to $3 \times 10^{18}$ atoms/cm$^3$.

The mobility of the N-channel TFT formed in the present example can be increased to 150 cm$^2$/Vs or higher. Also, a threshold voltage Vth can be reduced and have an excellent characteristics. Further, a variation of the mobility can be kept within a range of ±10%. This small variation is assumed to be caused by an improvement of the crystallinity due to the laser light irradiation which follows an incomplete crystallization by a heat treatment. Although it is possible to obtain a crystalline film having a mobility of 150 cm$^2$/Vs or higher even with only the laser irradiation, the uniformity of such a film is not so good.

EXAMPLE 5

In this example, nickel is selectively introduced as described in Example 2 and an electronic device is formed using the lateral growth region. The nickel concentration in the channel region of the device can be lowered. This is particularly advantageous in terms of electrical stability or reliability of the device.

Figure 4A:
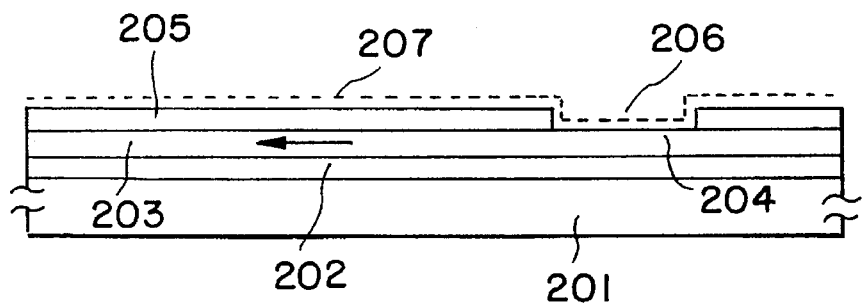
FIGS. 4A–4F show a method for manufacturing a TFT in accordance with EXAMPLE 4 of the invention.

Referring to FIG. 4A, a substrate 201 is washed and provided with a silicon oxide film 202 thereon. The silicon oxide film 202 is formed through a plasma CVD with oxygen and tetraethoxysilane used as starting gases. The thickness of the film is 2000 Å, for example. Then, an amorphous silicon film 203 of an intrinsic type having a thickness of 500–1500 Å, for example, 1000 Å is formed on the silicon oxide film 202, following which a silicon oxide film 205 of 500–2000 Å, for example 1000 Å is formed on the amorphous silicon film successively. Further, the silicon oxide film 205 is selectively etched in order to form an exposed region 206.

Then, a nickel containing solution (an acetic acid salt solution here) is coated on the entire surface in the same manner as in Example 2. The concentration of nickel in the acetic acid salt solution is 100 ppm. The other conditions are the same as in Example 2. Thus, a nickel containing film 207 is formed.

The amorphous silicon film 203 provided with the nickel containing film in contact therewith is crystallized through a heat annealing at 500°–620° C. for 4 hours in a nitrogen atmosphere. The crystallization starts from the region 206 where the silicon film directly contacts the nickel containing film and further proceeds in a direction parallel with the substrate. In the figure, a reference numeral 204 indicates a portion of the silicon film where the silicon film is directly added with nickel and crystallized while a reference numeral 203 indicates a portion where the crystal grows in a lateral direction. The crystals grown in the lateral direction are about 25 µm. Also, the direction of the crystal growth is approximately along an axis of [111]. (FIG. 4A)

After the above crystallization, the crystallinity of the silicon film is further improved by an infrared ray irradiation. An IR light having a wavelength of 1.2 µm is used. An effect achieved by this step is equivalent with that obtainable using a high temperature treatment for some minutes.

A halogen lamp is used as a light source of the infrared light. The intensity of the IR light is controlled so that a temperature on the surface of a monitoring single crystalline silicon wafer is set between 900°–1200° C. More specifically, the temperature is monitored by means of a thermocouple embedded in a single crystal silicon wafer and is transferred back to the IR light source (feed back). In the present example, the temperature rising rate is kept constant in the range of 50°–200° C./sec. and also the substrate is cooled naturally at 20°–100° C./sec. Since the IR light can heat the silicon film selectively, it is possible to minimize the heating of the glass substrate.

Figure 4B:
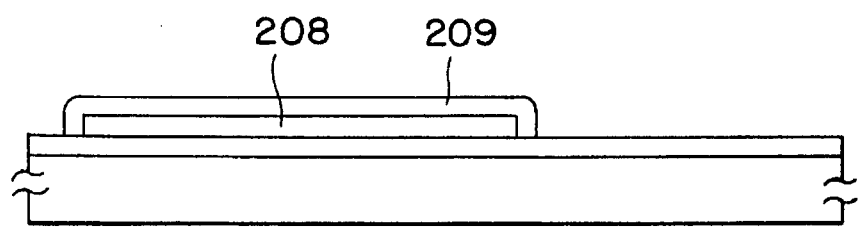

After the crystallization, the silicon oxide film 205 is removed. At this time, an oxide film formed on the silicon film on the region 206 is simultaneously removed. Further, the silicon film 204 is patterned by dry etching to form an active layer 208 in the form of an island as shown in FIG. 4B. It should be noted that the nickel is contained in the silicon film at a higher concentration not only in the region 206 where the nickel is directly added but also in a region where top ends of the crystals exist. The patterning of the silicon film should be done in such a manner that the patterned silicon film 208 should not include such regions in which nickel is contained at a higher concentration.

The patterned active layer 208 is then exposed to an atmosphere containing 100% aqueous vapor at 10 atm and at 500°–600° C., typically, 550° C. for one hour in order to oxidize the surface thereof and thus to form a silicon oxide film 209 of 1000 Å. After the oxidation, the substrate is maintained in an ammonium atmosphere (1 atm, 100%) at 400° C. At this condition, the silicon oxide film 209 is irradiated with an infrared light having an intensity peak at a wavelength in the range of 0.6–4 µm, for example, 0.8–1.4 µm for 30–180 seconds in order to nitride the silicon oxide film 209. HCl may be added to the atmosphere at 0.1 to 10%.

Figure 4C:
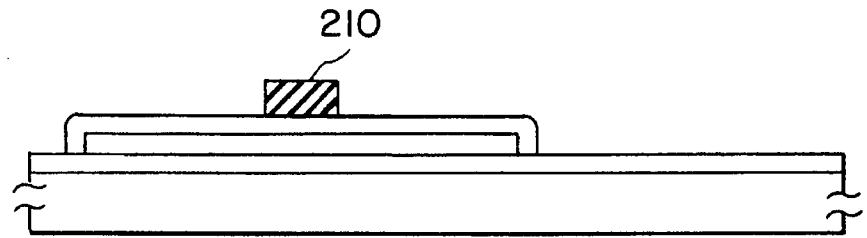

Referring to FIG. 4C, an aluminum film is formed on the oxide film by a sputtering method to a thickness of 3000–8000 Å, for example, 6000 Å and then patterned into a gate electrode 210. The aluminum film is preferably added with scandium at 0.01–0.2%.

Figure 4D:
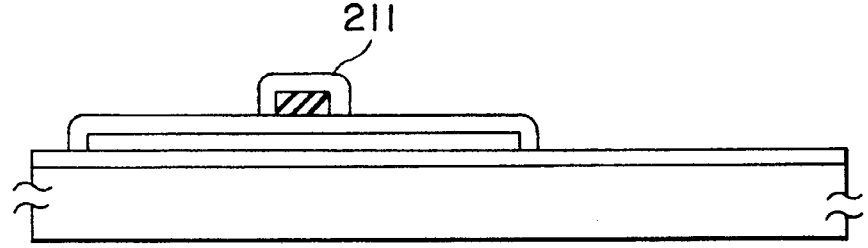

Referring to FIG. 4D, the surface of the aluminum electrode 210 is anodic oxidized to form an anodic oxide film 211 in an ethylene glycol solution containing a tartaric acid at 1–5%. The thickness of the oxide film 211 is 2000 Å, which will determine the size of an offset gate area which is to be formed in a later step as discussed below.

Figure 4E:
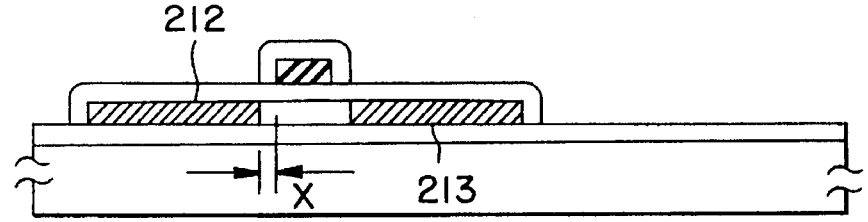

Referring then to FIG. 4E, using the gate electrode 210 and the surrounding anodic oxide film 211 as a mask, an N-type conductivity impurity (phosphorous, here) is introduced into the active layer in a self-aligning manner by ion doping method (also called as plasma doping method) in order to form impurity regions 212 and 213. Phosphine (PH$_3$) is used as a dopant gas. The acceleration voltage is 60–90 kV, for example, 80 kV. The dose amount is $1 \times 10^{15}$–$8 \times 10^{15}$ cm$^{-2}$, for example, $4 \times 10^{15}$ cm$^{-2}$. As can be seen in the drawing, the impurity regions 212 and 213 are offset from the gate electrode by a distance "x". This configuration is advantageous for reducing a leak current (off current) which occurs when applying a reverse bias voltage (i.e. a negative voltage in the case of an NTFT) to the gate electrode. In particular, since it is desired that electric charges stored in a pixel electrode be maintained without leaking in order to obtain an excellent display, the offset configuration is particularly advantageous when the TFT is used for controlling a pixel of an active matrix as is the case in the present example.

Thereafter, an annealing is performed with a laser irradiation. As a laser, a KrF excimer laser (wavelength: 248 nm, pulse width: 20 nsec.) or other lasers may be used. The conditions of the laser irradiation in the case of KrF excimer laser are: energy density is 200–400 mJ/cm$^2$, for example, 250 mJ/cm$^2$, a number of shots is 2–10 shots per one site, for example, 2 shots. Preferably, the substrate is heated to 200°–450° C. to enhance the effect of the irradiation.

Figure 4F:
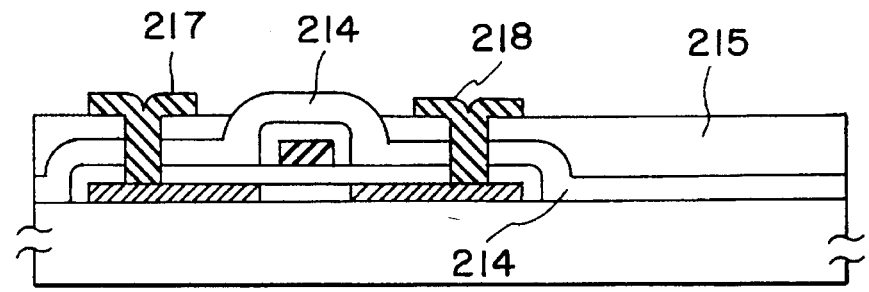

Referring to FIG. 4F, an interlayer insulating film 214 of silicon oxide is formed through a plasma CVD to a thickness of 6000 Å. Further, a transparent polyimide film 215 is formed by spin coating to obtain a leveled surface.

The interlayer insulating films 214 and 215 are provided with contact holes, through which electrode/wirings 217 and 218 can reach the impurity regions of the TFT. The electrode/wirings 217 and 218 are formed of a metallic material, for example, a multi-layer of titanium nitride and aluminum.

Finally, an annealing in a hydrogen atmosphere of 1 atm is carried out at 350° C. for 30 minutes in order to complete a pixel circuit of an active matrix circuit having TFTs.

The TFT of this example has a high mobility so that it is usable for a driver circuit of an active matrix type liquid crystal device.

EXAMPLE 5

Figure 5A:
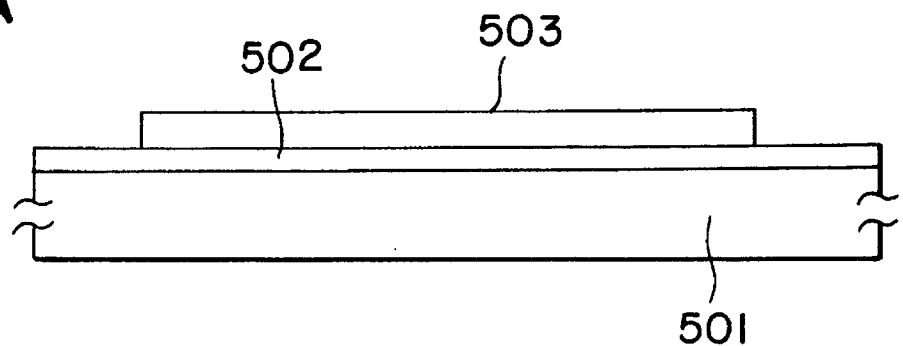
FIGS. 5A–5D show a method for manufacturing a TFT in accordance with EXAMPLE 5 of the invention.

This example is directed to a manufacture of a TFT and will be described with reference to FIGS. 5A–5D. Referring to FIG. 5A, a base film 502 of silicon oxide is initially formed on a Corning 7059 substrate 501 by sputtering to 2000 Å thick. The substrate is annealed at a temperature higher than a distortion point of the substrate and then the glass is cooled to a temperature less than the distortion point at a rate of 0.1°–1.0° C./minute. Thereby, it is possible to reduce a contraction of the substrate due to a substrate heating which occurs later (for example, thermal oxidation, thermal annealing). As a result, a mask alignment process will be eased. This step may be performed either before or after the formation of the base film 201. In the case of using the Corning 7059 substrate, the substrate may be heated at 620°–660° C. for 1–4 hours, following which it is cooled at 0.03 to 1.0° C./minute, preferably 0.1°–0.3° C./minute and taken out from a furnace when the temperature decreases to 400°–500° C.

Then, an intrinsic (I-type) amorphous silicon film is formed on the base film to 500–1500 Å thick, for example, 1000 Å through plasma CVD. The amorphous silicon film is provided with nickel by the method disclosed in Example 1 and crystallized at 550° C. for 4 hours in a nitrogen atmosphere at 1 atm. Further, the silicon film is irradiated with a KrF excimer laser to improve the crystallinity. After the crystallization, the silicon film is patterned into an island form having a dimension of 10–1000 microns square. Accordingly, a crystalline silicon film 503 in the form of an island is formed as an active layer of a TFT as shown in FIG. 5A.

Figure 5B:
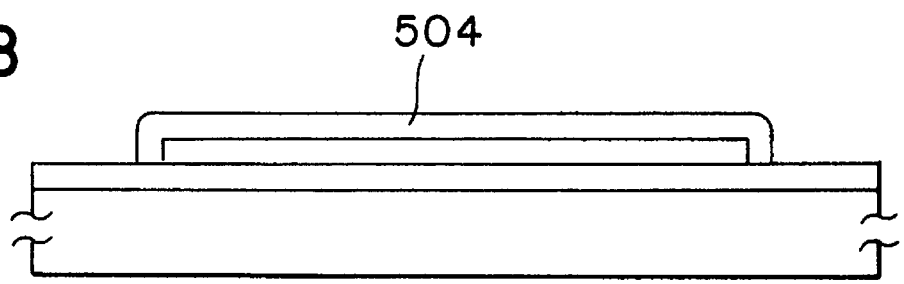

Referring to FIG. 5B, the surface of the silicon film is oxidized by exposing the surface to an oxidizing atmosphere to form an oxide film 504. The oxidizing atmosphere contains an aqueous vapor at 70–90%. The pressure and temperature of the atmosphere is 1 atm and 500°–750° C., typically 600° C. The atmosphere is produced by a pyrogenic reaction from oxygen and hydrogen gases with a hydrogen/oxygen ratio being 1.5–1.9. The silicon film is exposed to the thus formed atmosphere for 3–5 hours. As a result, the oxide film 504 having a thickness of 500–1500 Å, for example, 1000 Å is formed. Since the surface of the silicon film is reduced (eaten) by 50 Å or more due to the oxidation, an influence of a contamination of the upper most surface of the silicon film does not extend to the silicon/silicon oxide interface. In other words, by the oxidation, it is possible to obtain a clean silicon/silicon oxide interface. Also, since the thickness of the silicon oxide film is two times as thick as the thickness of the portion of the silicon film to be oxidized, when the silicon film is originally 1000 Å thick and the silicon oxide film obtained is 1000 Å, the thickness of the silicon film remaining after the oxidation is 500 Å.

Generally, the thinner a silicon oxide film (gate insulating film) and an active layer are, the higher a mobility is and the smaller an off current is. On the other hand, a preliminary crystallization of an amorphous silicon film is easier when its thickness is thicker. Accordingly, there was a contradiction in the crystallization process and electrical characteristics with respect to the thickness of the active layer. The present example solves this problem for the first time. That is, the amorphous silicon film having a larger thickness is initially formed so that a better crystalline silicon film can be obtained, following which the thickness of the silicon film is reduced by the oxidation, resulting in an improvement of characteristics of the active layer of a TFT. Moreover, an amorphous component or grain boundaries contained in the crystalline silicon film tend to be oxidized during the thermal oxidation, resulting in a decrease in recombination centers contained the active layer.

After the formation of the silicon oxide film 504 through thermal oxidation, the substrate is annealed in a 100% monoxide dinitrogen atmosphere at 1 atm and 600° C. for 2 hours.

Figure 5C:
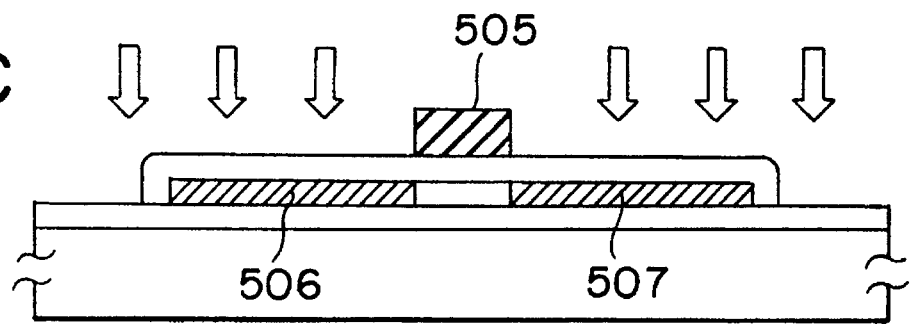

Referring, to FIG. 5C a silicon in which 0.01 to 0.2% phosphorous is added is deposited through low pressure CVD to 3000–8000 Å thick, for example, 6000 Å, and then patterned into a gate electrode 505. Further, using the silicon film as a mask an N-type conductivity impurity is added into a portion of the active layer in a self-aligning manner by ion doping. Phosphine is used as a dopant gas. The acceleration voltage is 60–90 kV, for example, 80 kV. Also, the dose amount is, for example, $5 \times 10^{15}$ cm-2. Thus, N-type impurity regions 506 and 507 are formed.

Thereafter, an annealing with a KrF excimer laser (wavelength 248 nm, pulse width 20 nsec) is carried out. The power density is 200–400 mJ/cm$^2$, for example, 250 mJ/cm$^2$. The number of shots is 2–10, for example, 2 shots per one site. The substrate may be heated to 200°–450° C. during the laser irradiation. (FIG. 5C)

The laser annealing may be replaced by a lamp annealing with a near infrared ray. The near infrared ray is absorbed by crystalline silicon more effectively than by amorphous silicon. Accordingly, the annealing with the near infrared ray is comparable with a thermal annealing at 1000° C. or higher. On the other hand, it is possible to prevent the glass substrate from being detrimentally heated inasmuch as the near infrared ray is not so absorbed by the glass substrate and the irradiation time is short. That is, although a far infrared ray is absorbed by a glass substrate, visible or near infrared ray of which wavelength ranges from 0.5–4 μm are not so absorbed.

Referring to FIG., 5D an interlayer insulating film 508 of silicon oxide is formed to 6000 Å, thick by a plasma CVD. A polyimide may be used instead of silicon oxide. Further, contact holes are formed through the insulating film. Electrode/wirings 509 and 510 are formed through the contact holes by using a multilayer of titanium nitride and aluminum films. Finally, an annealing in a hydrogen atmosphere is conducted at 350° C. and 1 atm for 30 minutes. Thus, a TFT is completed.

The mobility of the thus formed TFT is 110–150 cm$^2$/Vs. The S value is 0.2–0.5 V/digit. Also, in the case of forming a P-channel type TFT by doping boron into source and drain regions, the mobility is 90–120 cm$^2$/Vs and the S value is 0.4–0.6 V/digit. The mobility in accordance with the present example can be increased by 20% or more and the S value can be reduced by 20% or more as compared with a case where a gate insulating film is formed by a known PVD or CVD.

Also, the reliability of the TFT in accordance with the present example is comparable to that of a TFT which is produced through a thermal oxidation at a temperature as high as 1000° C.

EXAMPLE 6

FIGS. 6A through 6F are cross sectional views for showing a manufacturing process in accordance with this example. This example is generally directed to a TFT which is to be placed on a pixel portion of a liquid crystal device of an active matrix type.

Initially, a silicon oxide film 52 of 2000 Å thick is formed on a Corning 7059 substrate 51 as a base film. Then, an amorphous silicon film of an intrinsic type is deposited to a thickness of 200–1500 Å, for example, 800 Å through a plasma CVD. The introduction of nickel is conducted in the same manner as in the Example 1. The silicon film is crystallized by heating at 550° C. for 4 hours in nitrogen, following which a KrF excimer laser is irradiated thereon for further improving the crystallinity. The silicon film is then patterned into an island form crystalline silicon film 53. And then, a silicon oxide film 54 of 1000 Å thick is formed covering the silicon island 53.

Figure 6A:
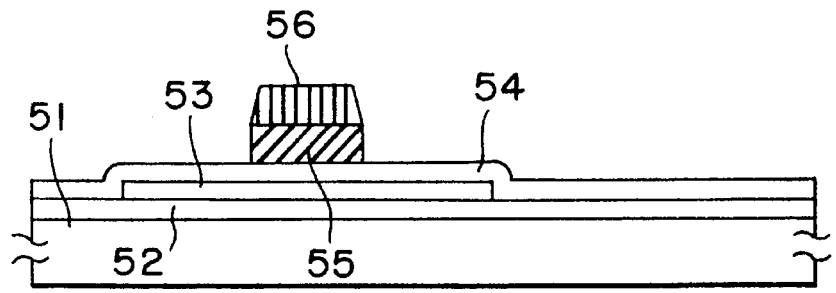
FIGS. 6A–6F show a method for manufacturing a TFT in accordance with EXAMPLE 6 of the invention.

Next, an aluminum film of 3000–8000, for example, 6000 Å thick which contains 0.1–0.3 weight % scandium is formed on the silicon oxide film 54 by sputtering. The upper surface of the aluminum film is provided with a thin anodic oxide film of 100–400 Å. A photoresist is formed on the thus formed aluminum film by spin coating to a thickness of 1 µm. Then, a gate electrode 55 is obtained by a known photolithography method. The reference numeral 56 shows the resist which remains on the aluminum and is to function as a mask. (FIG. 6A)

Figure 6B:
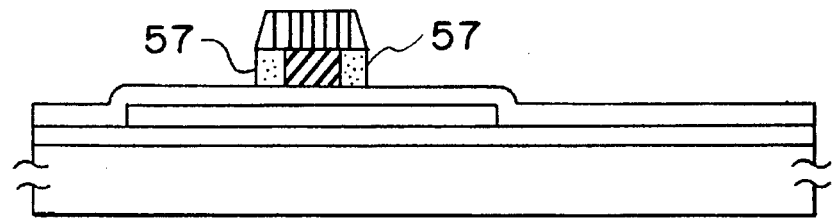

Then, the substrate is immersed in a 10 %oxalic acid water solution, in which an anodic oxide is to be carried out at a constant voltage of 5–50 V, for example, 8 V, for a duration of 10–500 minutes, for example, 200 minutes. By the anodic oxidation, a porous anodic oxide film 57 is formed on the side surface of the gate electrode. The anodic oxidation does not occur on the upper surface of the gate electrode because of the existence of photoresist mask 56. (FIG. 6B)

Figure 6C:
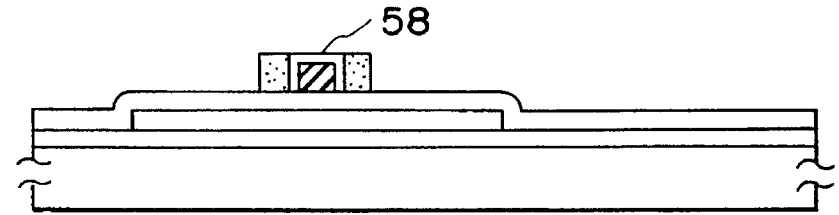

Then, the mask is removed to expose the upper surface of the gate electrode, following which the substrate is immersed in an ethylene glycol solution of 3% tartaric acid (of which pH is controlled to be neutral by ammonium) where another anodic oxidation is carried out with a voltage increased at a rate of 1–5 V/minute, for example, at 4 V/minute to 100 V. At this time, not only an upper surface of the gate electrode but also the side surface thereof are anodic oxidized and a dense, non-porous anodic oxide 58 is formed thereon to a thickness of 1000 Å. The dielectric strength of this anodic oxide is 50 V or more. (FIG. 6C)

Figure 6D:
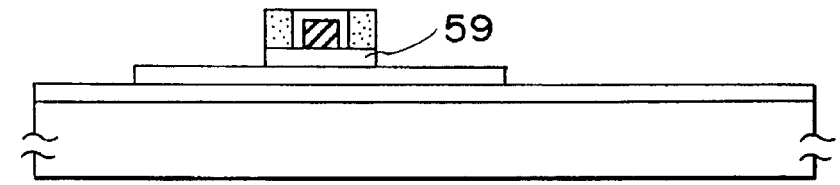

Then, the silicon oxide film 54 is patterned by dry etching. The anodic oxides 57 and 58 remain without being etched by the dry etching. The silicon oxide film located below the anodic oxide also remains without being etched so that a gate insulating film 59 is formed. (FIG. 6D)

Next, a mixed acid of a phosphoric acid, acetate acid and a nitric acid is provided in order to etch the porous anodic oxide 57 to expose the non-porous anodic oxide 58. Thereafter, an impurity (phosphorous) is introduced into the silicon region 33 by plasma doping using the gate electrode and the non-porous anodic oxide 58 as a mask in a self-aligning manner. Phosphine ($PH_3$) is used as a doping gas. The acceleration voltage is 5–30 kV, for example 10 kV. The dose amount is $1\times10^{14}$ to $8\times10^{15}$ atoms/cm$^2$, for example, $2\times10^{15}$.

Figure 6E:
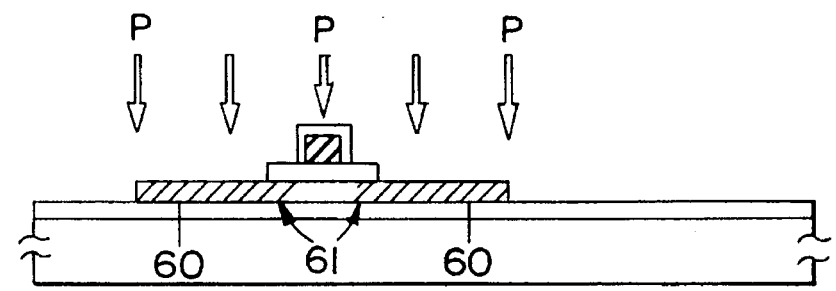

In the doping, the region 60 which is not covered with the gate insulating film 59 is added with the phosphorous at a high concentration while the region 61 which is covered with the gate insulating film 59 is not so added with the impurity since ions are mostly blocked by the gate insulating film. For example, the concentration of phosphorous in the region 61 is only 0.1 to 5% of that in the region 60. As a result, an N-type high concentration impurity regions 60 and a low concentration impurity regions 61 are formed. (FIG. 6E)

Figure 6F:
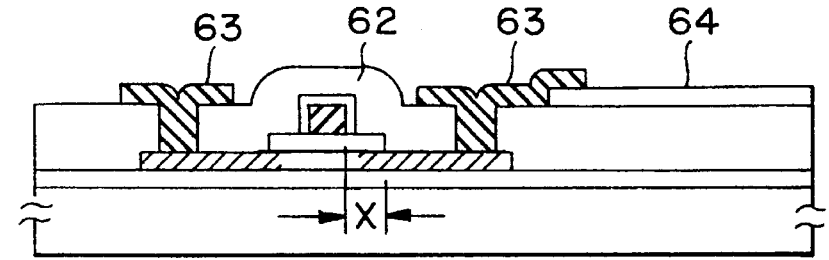

The introduced impurity is activated by an irradiation of laser light from the upper portion of the substrate. Subsequently, a silicon oxide film 62 of 6000 Å thick is formed by plasma CVD as an interlayer insulator. An ITO electrode 64 which is to be a pixel electrode is formed thereon. Further, contact holes are formed through the interlayer insulating film, and electrode/wiring 63 are formed on the source and drain regions by using a multilayer film of a titanium nitride and aluminum. Finally, an annealing at 350° C. for 30 minutes is carried out in a hydrogen atmosphere of 1 atm. Thus, a thin film transistor is completed as shown in FIG. 6F.

The TFT thus obtained has the same structure as that so called lightly doped drain (LDD). While an LDD structure is advantageous for suppressing a degradation due to hot carriers, the TFT of the present invention has the same advantage. However, the process of the present invention uses only one doping step when compared with a conventional process. Also, the present example has a characterizing feature in which the gate insulating film which is defined by the porous anodic oxide 57 is used to determine the region of the high concentration impurity regions 60. That is, the impurity regions are indirectly determined by the porous anodic oxide 57. Therefore, the width of the LDD region "x" is substantially determined by the width of the porous anodic oxide.

The method of the present example is advantageous for implementing a higher level integration. At that time, it is advantageous if the width "x" of the LDD region or an offset region is varied depending upon desired characteristics of TFTs. In particular, the construction of the present invention achieves the reduction in the off current, which optimizes a TFT connected to a pixel for retaining electric charges.

Figure 7:
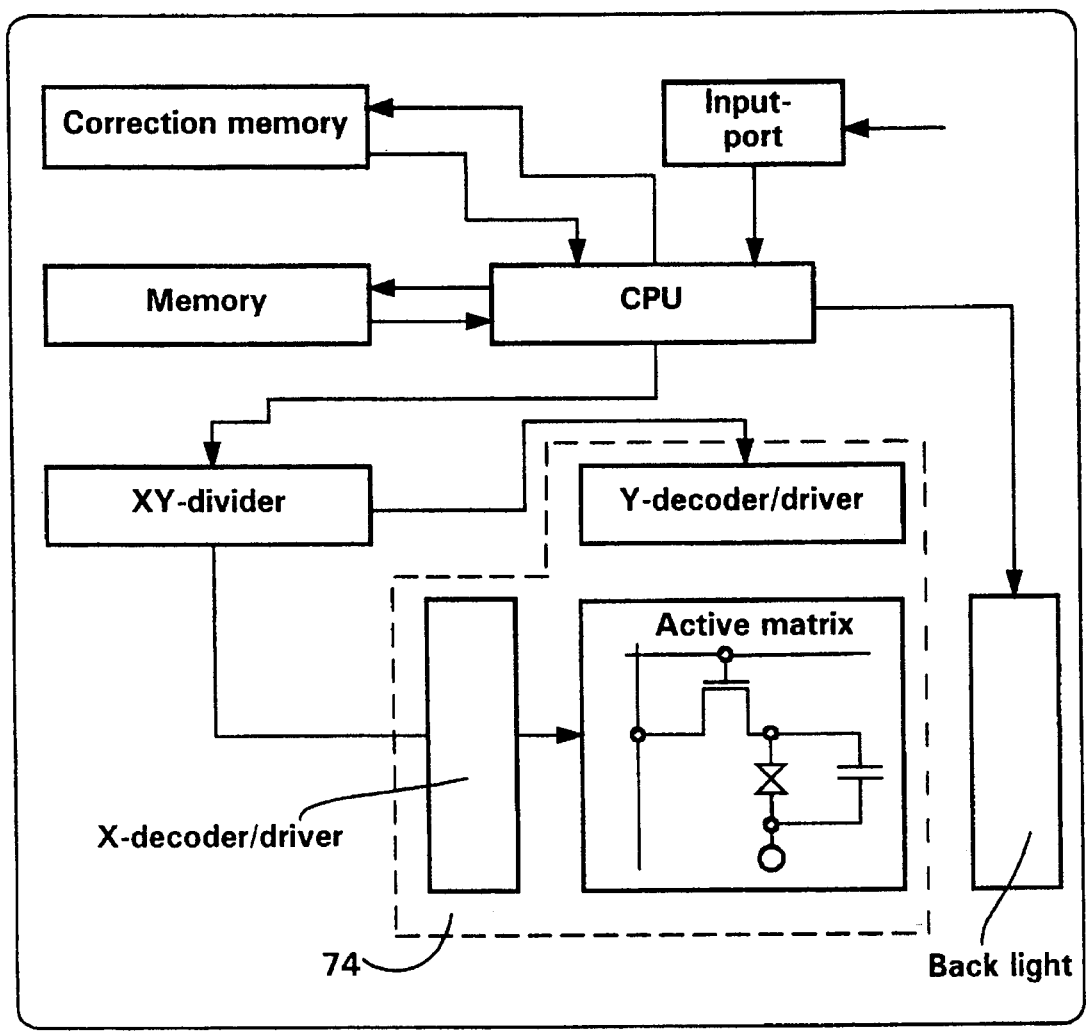
FIG. 7 show a block diagram of an electro-optical device in accordance with EXAMPLE 6 of the invention.

FIG. 7 shows a block diagram of an electro-optical system (device) in which a display, CPU and memory is integrated on one glass substrate. In the diagram, the input port is to read a signal input from an outside and to convert it into a display signal, and the correction memory which is peculiar to each panel is to correct the input signal or the like in accordance with a specific characteristics of an active matrix panel. Especially, the correction memory uses a non-volatile memory in which an information of each pixel is stored in order to perform the correction at each pixel. That is, if there is a defective pixel (point defect) in the electro-optical device, pixels surrounding the defective pixel are supplied with signals which are corrected in order to disappear or cover the defect pixel. Also, when there is a pixel of which brightness is lower than others, the signal to be applied to that pixel is corrected to be a larger signal, thereby, the brightness of that pixel becomes the same as its surrounding pixels.

The CPU and the memory are equivalent to those used in a normal computer. Especially, the memory uses a RAM in which an image memory corresponding to each pixel is stored. Also, it has a function of changing an intensity of back light on the rear side of the substrate in response to the image information.

In order to obtain an appropriate width of an offset region or LDD region in accordance with each of the foregoing circuits, 3 to 10 systems of wirings are formed in order to make it possible to vary conditions of the anodic oxidation for each circuit. In a typical example, (a) for TFTs of an active matrix circuit, the width of the LDD should be 0.4–1 μm, for example, 0.6 μm when the channel length is 10 μm; (b) for a driver, the width of the LDD should be 0.2–0.3 μm, for example, 0.25 μm when an N-channel TFT having a channel length of 8 μm and channel width of 200 μm is used, and the width of the LDD should be 0–0.2 μm, for example, 0.1 μm when a p-channel TFT having a channel length of 5 μm and a channel width of 50 μm is used; and (c) for a decoder, the width of the LDD should be 0.3–0.4 μm, e.g. 0.35 μm when an n-channel TFT having a channel length of 8 μm and channel width of 10 μm is used, and the width of the LDD should be 0–0.2 μm, e.g. 0.1 μm when a p-channel TFT having a channel length of 5 μm and a channel width of 10 μm is used. Furthermore, the width of an LDD in each NTFT and PTFT of the CPU, input port, correction memory and memory should be optimized in the same manner as that of the decoder which is required to operate at a high frequency with a low power consumption. Thus, an electro-optical device 74 is formed on the same substrate having an insulating surface.

Figure 5D:
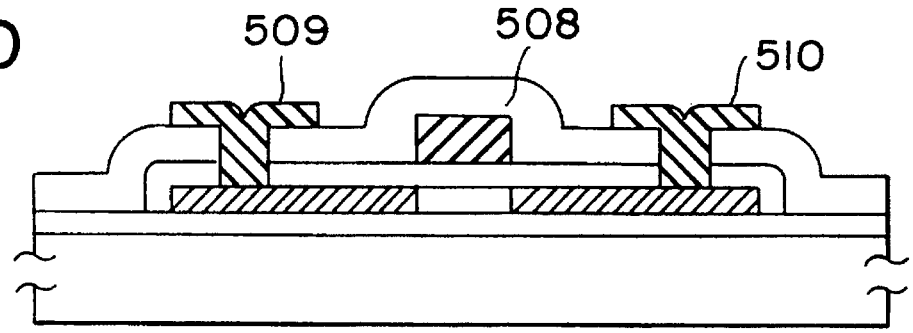

The present invention is characterized in that the width of a high resistance region can be varied in two to four ways depending upon the required characteristics of each circuit. Also, this region does not need to be the same material or the same conductivity type of the channel forming region. That is, a high resistance region can be formed by adding thereto a trace amount of an N-type dopant in case of an NTFT or a trace amount of a P-type dopant in case of a PTFT. Also, it is possible to form a high resistance region by selectively adding an impurity such as carbon, oxygen or nitrogen. Thus, a problem of a degradation in reliability or frequency characteristics due to a hot carrier or an off current can be avoided. Also, the TFTs shown in FIGS. 3E, 4F, and 5D are suitable for a driver circuit for driving a TFT provided to a pixel electrode.

While the present invention is disclosed in the preferred embodiments, it is to be understood that the scope of the present invention should not be limited to those particular examples, but only limited to the appended claims.

These are some methods to perform solid phase crystallization by using a metal catalyst. In using such metal catalyst elements, including Ni, Fe, Co, Ru, Rh, Pd, Os, Ir, Pt, Cu, Au, etc., the conventional method was physical formation such as sputtering method, electron beam evaporation method, etc.

In this case, a film including the catalyst of 5 to 200 Å in average thickness, e.g. 10 to 50 Å thick is formed in an island-form on a surface. That is, the catalyst element is dotted on the surface in the form of micrograins with an average diameter of 50 to 200 Å. The grain are separated from each other by approximately 100 to 1000 Å. In other words, it does not form a continuous film in any way, but forms a discontinuous film. Consequently, the metal islands form nuclei for crystallization. Crystals are grown from the nuclei in an amorphous silicon film on an insulating substrate by means of a thermal treatment at 450° C. to 600° C.

In the above conventional method, the crystallization temperature can be dropped by 50° to 100° C., in comparison to when such catalyst elements are not used for the crystallization. However, the following thing became clear as a result of observing the crystallized film carefully. A number of amorphous regions are left and that such regions have a metallic property. It is presumed that the metal catalyst is left as they are.

These metal regions form recombination centers of electrons and halls. Adding a reverse bias voltage to a semiconductor device, in particular, PI or NI junction because of the metal region existing in the junction region, it has quite inferior characteristics in that a leak current is increased. When thin-film transistors of channel length/channel width=8 μm/8 μm is formed with such a semiconductor layer, the Off-state current is $10^{-10}$ to $10^{-6}$ A, which is $10^2$ to $10^6$ times larger than $10^{12}$ although an OFF=-state current should be as small as about $10^{12}$ A.

The present invention aims at giving the chemical formation method which is quite different from above. In order to solve the problem above, it is a characteristic of the present invention to form a catalytic layer by using a solution (water, isopropyl alcohol, etc.) which contains a metal organic compound at a concentration 10 ppm to 100 ppm. For example, the following metal complex salt can be used as the metal compound. Namely, ferrous bromide ($FeBr_2 6H_2O$), ferric bromide ($FeBr_3 6H_2O$), ferric acetate ($Fe(C_2H_3O_2)_3 \ xH_2O$), ferrous chloride ($FeCl_2 \ 4H_2O$), ferric chloride ($FeCl_3 \ 6H_2O$), ferric fluoride ($FeF_3 \ 3H_2O$), ferric nitrate ($Fe(NO_3)_3 \ 9H_2O$), ferrous phosphate ($Fe_3(PO_4)_2 \ 8H_2O$), ferric phosphate ($FePO_4 \ 2H_2O$), cobalt bromide ($CoBr \ 6H_2O$), cobalt acetate ($Co(C_2H_3O_2)_2 \ 4H_2O$), cobalt chloride ($CoCl_2 6H_2O$), cobalt fluoride ($CoF_2 xH_2O$), cobalt nitrate ($Co(NO_3)_2 \ 6H_2O$), ruthenium chloride ($RUCl_3 \ H_2O$), rhodium chloride ($RhCl_3 \ 3H_2O$), palladium chloride ($PdCl_2 \ 2H_2O$), osmium chloride ($OsCl_3$), iridium trichloride ($IrCl_3 \ 3H_2O$), iridium tetrachloride ($IrCl_4$), platinic chloride ($PtCl_4 \ 5H_2O$), cupric acetate ($Cu(CH_3COO)_2$), cupric chloride ($CuCl_2 \ 2H_2O$), cupric nitrate ($Cu(NO_3)_2 \ 3H_2O$), auric trichloride ($AuCl_3 \ xH_2O$), auric chloride ($AuHCl_4 \ 4H_2O$), sodium auric tetrachloride ($AuNaCl_4 \ 2H_2O$).

The above materials can be dispersed in a solution in a monomolecular form. This solution can be spread on an entire surface of a substrate by spin coating in which the solution is dropped and then the substrate is rotated at a rotational speed of 50 to 500 r.p.m.

When a silicon oxide film of 5 to 100 Å thick is formed on the surface of a silicon semiconductor in order to improve a wettability of the silicon surface with respect to the solution, this thin film can prevent the solution from becoming spot condition by the surface tension of liquid. It is also practicable to improve the wettability of semiconductor silicon without a silicon oxide film by adding a surface active agent into the solution.

In these methods, the metal catalyst atoms can be dispersed into semiconductor through the oxide film. In particular, it is possible to promote a crystallization without forming crystal nuclei in the form of grains. Therefore, it is a favorable method.

It is also useful to coat the organic metal uniformly and a UV treatment (ozone treatment) in oxygen is performed for formation of a metal oxide film. In this case, oxidized organic substance can be vaporized and removed as carbon dioxide, so it is possible to make the solid phase growth more uniform.

When the spin coating is carded out only at low rational speed, too much metal constituent for solid phase growth is apt to be supplied into the semiconductor film. Therefore, after the rotation at a low speed, the substance is rotated at 1000 to 10,000 r.p.m., e.g., 2000 to 5000 r.p.m. Thus, an excess organic metal can be eliminated from the surface of substrate and the surface can be dried sufficiently. Moreover, it is effective to control the amount of the organic metal to be formed on the surface. In the above chemical formation method, a continuous layer can be formed on a surface of semiconductor without forming nuclei of metal particles for crystallization.

A metal catalyst layer becomes inhomogeneous layer when it is formed by a physical formation method, on the other hand, it becomes homogeneous layer when it is formed by a chemical method as is the case in the present invention.

In accordance with the above new concept, the crystals can be grown far more uniformly on an entire surface of the semiconductor film when the crystallization is performed by thermal treatment which is performed at 450° C. to 650° C. Therefore, it is possible to form excellent P-I and N-I junctions by using the thus crystallized semiconductor film. In this case, the leak is controlled to be as small as $10^{-12}$ A even if a reverse bias voltage is applied.

In the case of a physical method, 90 to 100 out of 100 P-I junctions have a large leak current, that is $10^{-10}$ to $10^{-5}$ A and 50 to 70 out of 100 N-I junctions have $10^{-12}$ to $10^{-6}$ leak current. On the other hand, in the chemical method of the present invention, 5 to 20 out of 100 P-I junctions have a leak current as small as $10^{-13}$ to $10^{-8}$ A and 0 to 20 out of 100 N-I junctions have a leak current as small as $10^{-13}$ to $10^{-8}$ A. So, the present invention improves the characteristics quite remarkably because both an OFF-state current and the probability of a film that leak current is large are reduced.

Besides, the fine effect can be obtained in both P-channel TFTs (having a PIP junctions) and N-channel TFTs (having a NIN junctions) by forming the above semiconductor film on an insulating surface. Moreover, the present invention can reduce the probability by about 1 or 2 orders that TFTs having large leak current are formed. However, if the TFTs are used for making thin film IC, the probability which TFTs having large current are formed should be decreased $1/10^3$ to $1/10^9$.

In the present invention, after the thermal crystallization, a laser light having a wavelength 248 nm or 308 nm is irradiated on the surface of the semiconductor with the energy density being at 250 to 400 mJ/cm$^2$. The absorption of light is larger in the region that metal constituent exist largely compared to the silicon region crystallized. That is, the region which remains an amorphous structure becomes black optically while the crystal constituent is transparent. Because of this, the slightly remaining amorphous component can be melted by the irradiation of the laser light selectively. Further, the metal existing in the amorphous component can be dispersed to an atomic level in this manner.

As a result, it was possible to reduce the possibility that the metal regions are formed within a recrystallized film, and it was possible to reduce the leak current of a TFT to $10^{-13}$ to $10^{-12}$ A, and further, when $10^4$ to $10^8$ pieces of TFTs were manufactural, only 1–3 of them had an undesirable large leak current. This is because the metal regions which form recombination centers and cause the increase in a leak current are removed from the semiconductor film.

By spin coating in the present method, the leak current of the reversed direction i.e. Ioff is reduced by two orders, and the probability which TFTs having a large leak current exist can be reduced by two orders. Nevertheless, TFTs having a large leak current are formed. Assumably, the cause of forming such defective TFTs is that dust adheres to the surface of the semiconductor, on which organic metal concentrates. The characteristic can be improved by the improvement of experimental equipment.

An experiment was conducted in which laser light was irradiated to a film which was obtained by forming a catalyst metal through a conventional physical formation method and heat crystallizing. In this case, however, an OFF current could not be reduced at all at P-I or N-I junctions when a reverse bias voltage was applied, even if the semiconductor is fused by the irradiation of laser light for recrystallization because metal grains in the starting film tend to be too big.

Accordingly, the method which utilizes a chemical formation method for forming a continuous layer of an organic metal catalyst is entirely different from the conventional method which utilizes a physical formation method followed by a thermal crystallization process. It is clearly understood that the chemical formation method is superior.

Instead of using a solution for forming the continuous catalyst layer, it is possible to utilize a CVD method with an organic metal gas as a starting material. The method is quite effective in order to reduce both an OFF current and the probability which TFTs having a large leak current exist. Further, the process of the present invention is a homogeneous crystal growth, that is, isotropic growth by using metal catalyst. On the other hand, the process of the conventional method is a non-uniform crystal growth, that is, a non-isotropic growth by using metal nuclei.

In the present invention, there are two ways as to how the crystal growth occurs; one is that the crystals are grown in the transverse direction with the surface of the substrate and the other is that the crystals are grown in the vertical direction with the surface of the substrate from the lower side of the semiconductor to the upper side thereof or vice versa. In either case, it was possible to obtain a semiconductor having an excellent electrical characteristics.

We claim:

1. A method for manufacturing a semiconductor device comprising the steps of:

disposing a catalyst element for promoting a crystallization of silicon or a compound containing said catalyst element in a continuous layer in contact with an amorphous silicon film;

crystallizing said amorphous silicon film with said catalyst element or said compound kept in contact with said silicon film; and then improving a crystallinity of said silicon film by irradiating a laser light or an intense fight to said silicon film.

* * * * *

UNITED STATES PATENT AND TRADEMARK OFFICE
CERTIFICATE OF CORRECTION

PATENT NO.  : 5,612,250
DATED       : March 18, 1997
INVENTOR(S) : OHTANI et al.

It is certified that error appears in the above-identified patent and that said Letters Patent is hereby corrected as shown below:

Column 20,

In the last line of claim 1, please change "fight" to --light--.

Signed and Sealed this

Fifteenth Day of July, 1997

*Attest:*

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,612,250
DATED : Feb. 4, 1997
INVENTOR(S) : Hisashi Ohtani et al.

It is certified that error appears in the above-indentified patent and that said Letters Patent is hereby corrected as shown below:

On title page, add item

[73]. Assignee:  Semiconductor Energy Laboratory
                 Co., Ltd., Kanagawa, Japan
                       and
                 Sharp Kabushiki Kaisha,
                 Osaka, Japan Signed and Sealed this Ninth Day of December, 1997

*Attest:*

BRUCE LEHMAN

*Attesting Officer*      *Commissioner of Patents and Trademarks*